US012628710B2

(12) United States Patent
Yang

(10) Patent No.: US 12,628,710 B2
(45) Date of Patent: May 12, 2026

(54) SEMICONDUCTOR PACKAGE AND MANUFACTURING METHOD THEREOF

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 719 days.

(21) Appl. No.: 18/054,919

(22) Filed: Nov. 14, 2022

(65) Prior Publication Data

US 2024/0162126 A1 May 16, 2024

(51) Int. Cl.
| | |
|---|---|
| *H10W 90/00* | (2026.01) |
| *H10W 70/05* | (2026.01) |
| *H10W 70/63* | (2026.01) |
| *H10W 70/65* | (2026.01) |
| *H10W 74/01* | (2026.01) |
| *H10W 74/10* | (2026.01) |
| *H10W 72/00* | (2026.01) |
| *H10W 80/00* | (2026.01) |

(52) U.S. Cl.
CPC ....... *H10W 90/701* (2026.01); *H10W 70/093* (2026.01); *H10W 70/635* (2026.01); *H10W 70/65* (2026.01); *H10W 74/01* (2026.01); *H10W 74/117* (2026.01); *H10W 72/07331* (2026.01); *H10W 80/335* (2026.01); *H10W 90/734* (2026.01); *H10W 90/794* (2026.01)

(58) Field of Classification Search
CPC ................. H01L 21/4853; H01L 21/56; H01L 2224/08225; H01L 2224/32225; H01L 2224/80205; H01L 2224/838; H01L 23/13; H01L 23/3128; H01L 23/49811; H01L 23/49816; H01L 23/49827; H01L 23/49838; H01L 24/08; H01L 24/32; H01L 24/80; H01L 24/83
See application file for complete search history.

(56) References Cited

U.S. PATENT DOCUMENTS

| | | | |
|---|---|---|---|
| 5,668,405 A | | 9/1997 | Yamashita |
| 7,057,281 B2 * | | 6/2006 | Peng ................... H01L 23/4952 |
| | | | 257/E23.128 |

(Continued)

FOREIGN PATENT DOCUMENTS

| | | | | |
|---|---|---|---|---|
| TW | 200935574 A | * | 8/2009 | ......... H01L 25/0655 |
| TW | 201017860 A | | 5/2010 | |
| TW | 201104804 A | | 2/2011 | |

*Primary Examiner* — Telly D Green
(74) *Attorney, Agent, or Firm* — CKC & Partners Co., LLC

(57) ABSTRACT

The present disclosure is related to a semiconductor package. The semiconductor package includes a substrate and a semiconductor chip. The substrate includes a window through a center portion of the substrate, in which the substrate has an inner sidewall surrounding the window and a conductive foil located on a top surface of the substrate, in which the conductive foil extends beyond the inner sidewall of the substrate. The semiconductor chip is located on the top surface of the substrate, in which the conductive foil is located between the substrate and the semiconductor chip, and the semiconductor chip has a bonding pad electrically connected to the conductive foil.

12 Claims, 12 Drawing Sheets

100

(56) References Cited

U.S. PATENT DOCUMENTS

| | | | | |
|---|---|---|---|---|
| 7,365,424 | B2 * | 4/2008 | Seng | H01L 23/13 |
| | | | | 257/668 |
| 7,425,470 | B2 * | 9/2008 | Peng | H01L 23/4951 |
| | | | | 257/E23.128 |
| 7,989,939 | B2 * | 8/2011 | Hwang | H01L 23/49816 |
| | | | | 257/784 |
| 8,159,063 | B2 * | 4/2012 | Hung | H01L 24/50 |
| | | | | 257/695 |
| 9,177,903 | B2 * | 11/2015 | Ang | H01L 25/0652 |
| 11,322,475 | B2 * | 5/2022 | Lee | H01L 25/0652 |
| 2003/0205801 | A1 * | 11/2003 | Baik | H01L 23/4951 |
| | | | | 257/737 |
| 2005/0087864 | A1 * | 4/2005 | Yang | H01L 23/36 |
| | | | | 257/E23.079 |
| 2007/0228563 | A1 * | 10/2007 | Han | H01L 23/525 |
| | | | | 257/E21.503 |
| 2009/0256267 | A1 * | 10/2009 | Yang | H01L 23/4951 |
| | | | | 257/E23.141 |
| 2011/0062577 | A1 * | 3/2011 | Hung | H01L 24/50 |
| | | | | 257/693 |
| 2013/0015590 | A1 * | 1/2013 | Haba | G11C 5/04 |
| | | | | 257/778 |
| 2013/0336039 | A1 * | 12/2013 | Frans | G11C 5/02 |
| | | | | 365/51 |
| 2017/0103957 | A1 * | 4/2017 | Li | H01L 21/76892 |
| 2020/0286856 | A1 * | 9/2020 | Lee | H01L 23/5386 |

* cited by examiner

SEMICONDUCTOR PACKAGE AND MANUFACTURING METHOD THEREOF

BACKGROUND

Field of Invention

The present disclosure relates to a semiconductor package and a manufacturing method of the semiconductor package.

Description of Related Art

As the data rate of DRAM (dynamic random access memory) rises significantly while entering the era of DDR5 SDRAM (double data rate fifth-generation synchronous DRAM). The data rate is going to rise up to 8000 MHz (Mega Hertz). A traditional wBGA (window ball grid array) package using bonding wires to electrically connect DRAM chip and PCB (Printed circuit board) substrate is not capable to work at such high data rate.

The general solution of this problem is to use flip-chip BGA (ball grid array) package to package the memory. However, the formation of the flip-chip BGA includes a step in which copper pillars must be formed by additional semiconductor manufacturing process before packaging, which results in a long cycle time of packaging and the raise of the cost in the packaging process.

SUMMARY

One aspect of the present disclosure provides a semiconductor package.

According to one embodiment of the present disclosure, a semiconductor package includes a substrate and a semiconductor chip. The substrate includes a window through a center portion of the substrate, in which the substrate has an inner sidewall surrounding the window, and a conductive foil located on a top surface of the substrate, in which the conductive foil extends beyond the inner sidewall of the substrate. The semiconductor chip is located on the top surface of the substrate, in which the conductive foil is located between the substrate and the semiconductor chip, and the semiconductor chip has a bonding pad and is electrically connected to the conductive foil.

In some embodiments of the present disclosure, the semiconductor package further includes a molding compound located on the top surface of the substrate and surrounds the semiconductor chip.

In some embodiments of the present disclosure, the molding compound has a portion covering a top surface of the semiconductor chip.

In some embodiments of the present disclosure, the semiconductor package further includes a molding compound located in the window of the substrate and extending to a bottom surface of the substrate.

In some embodiments of the present disclosure, the molding compound is in contact with the conductive foil and the bonding pad.

In some embodiments of the present disclosure, a portion of the conductive foil and the bonding pad are directly above the window of the substrate.

In some embodiments of the present disclosure, the semiconductor package further includes an adhesive layer located between the semiconductor chip and the substrate.

In some embodiments of the present disclosure, the adhesive layer is located on the top surface of the substrate and surrounds the window.

In some embodiments of the present disclosure, the adhesive layer is in contact with the conductive foil of the substrate.

In some embodiments of the present disclosure, in which the substrate further includes a conductive via located in the substrate and through the top surface of the substrate and the bottom surface of the substrate.

In some embodiments of the present disclosure, in which a top end of the conductive via is electrically connected to the conductive foil.

In some embodiments of the present disclosure, in which the substrate further includes a conductive region electrically connected to a bottom end of the conductive via, and the semiconductor package further includes a solder ball located on the conductive region.

Another aspect of the present disclosure provides a manufacturing method of a semiconductor package.

According to one embodiment of the present disclosure, a manufacturing method of a semiconductor package includes: forming a window through a center portion of a substrate, such that the substrate has an inner sidewall surrounds the window, in which the substrate has a conductive foil located on a first surface of the substrate and extending beyond the inner sidewall of the substrate; attaching the substrate to the first surface of the semiconductor chip such that the conductive foil is located between the substrate and the semiconductor chip; and soldering the conductive foil of the substrate to a bonding pad of the semiconductor chip such that the bonding pad of the semiconductor chip is electrically connected to the conductive foil.

In some embodiments of the present disclosure, The manufacturing method of a semiconductor package further includes: forming a first portion of a molding compound on the first surface of the substrate and a second portion of the molding compound in the window of the substrate, in which the first portion of the molding compound surrounds the semiconductor chip and covers the semiconductor chip, and the second portion of the molding compound extends to a second surface of the substrate opposite the first surface of the substrate.

In some embodiments of the present disclosure, the manufacturing method of a semiconductor package further includes: attaching an adhesive layer to the semiconductor chip, in which the adhesive layer surrounds the bonding pad of the semiconductor chip; and attaching the substrate to the adhesive layer.

In some embodiments of the present disclosure, in which soldering the conductive foil of the substrate to the bonding pad of the semiconductor chip is performed by ultrasonic soldering.

In some embodiments of the present disclosure, in which forming the window through the center portion of the substrate is performed by punching.

In some embodiments of the present disclosure, in which the substrate includes a conductive via in the substrate and a conductive region on the second surface of the substrate, and the manufacturing method further includes: soldering a solder ball to the conductive region such that the solder ball is electrically connected to the conductive via.

In some embodiments of the present disclosure, the manufacturing method of a semiconductor package further includes: before forming the window through the center portion of the substrate, disposing a support paper on the conductive foil; and removing the support paper before attaching the substrate to the first surface of the semiconductor chip.

In the aforementioned embodiments of the present disclosure, since the substrate of the semiconductor package has a window and the conductive foil extending beyond the inner sidewall that surrounds the window, the bonding pad of the semiconductor chip can electrically connect to the conductive foil. As a result of such a design, the semiconductor package is capable of working at high data rate without using bonding wires or copper pillars. Moreover, the manufacturing method of the semiconductor package uses the soldering of the conductive foil of the substrate to the bonding pad of the semiconductor chip to electrically connect the semiconductor chip and the substrate, which avoids the necessity of forming copper pillar in the manufacturing process, thereby reducing the cycle time and the cost of the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
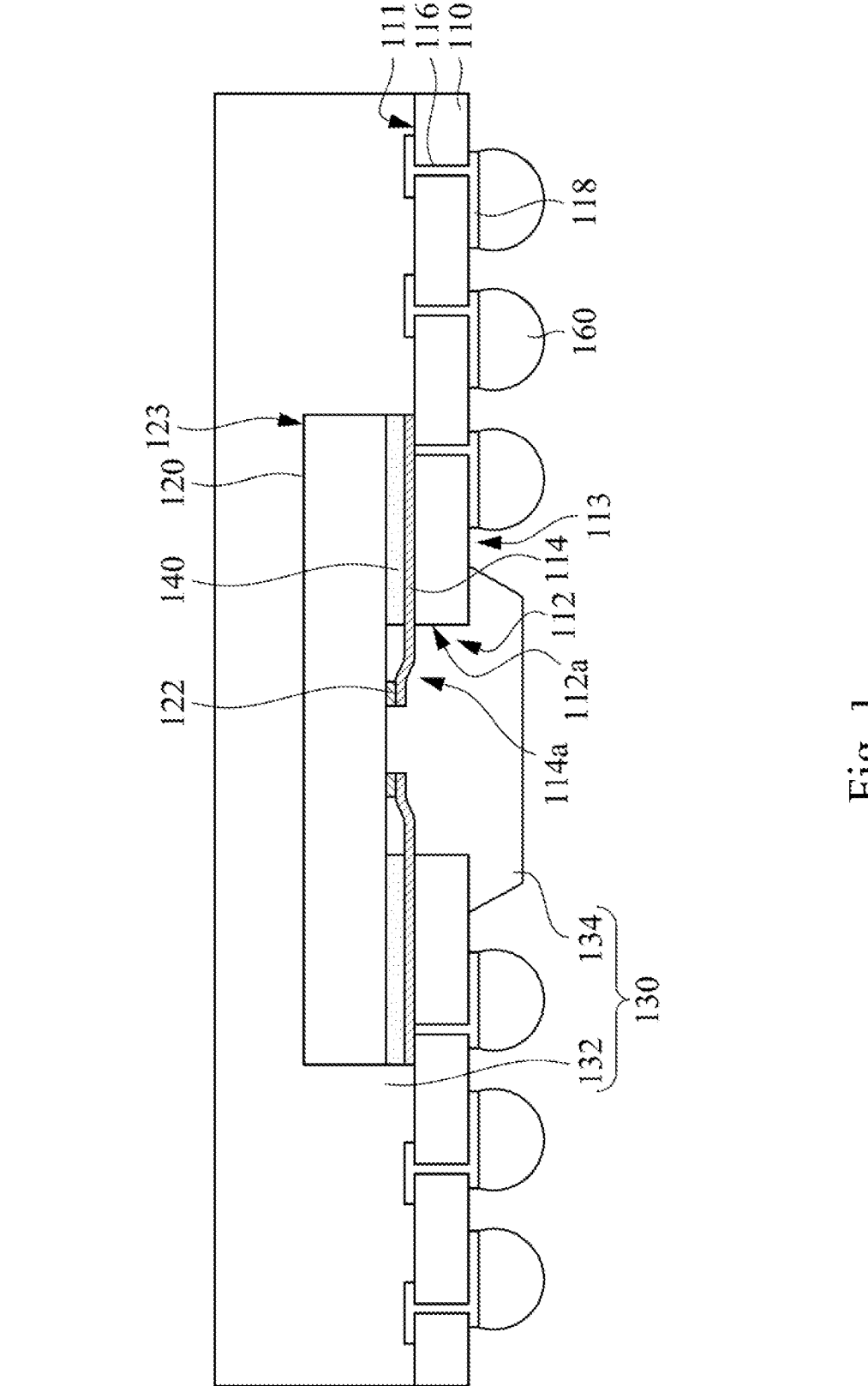
FIG. 1 is a cross-sectional view of a semiconductor package according to one embodiment of the present disclosure.

The following disclosure provides many different embodiments, or examples, for implementing different features of the provided subject matter.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of the semiconductor package 100. Refer to FIG. 1, a semiconductor package 100 includes a substrate 110 and a semiconductor chip 120. The substrate can be, for example, a printed circuit board (PCB), but not limited to it. The substrate 110 includes a window 112 through a center portion of the substrate, in which the substrate 110 has an inner sidewall 112a surrounding the window 112, and a conductive foil 114 located on a top surface 111 of the substrate 110, and the conductive foil 114 extends beyond the inner sidewall 112a of the substrate 110. The material of the conductive foil 114 can be, for example, copper, but not limited to it. In the drawing, the semiconductor chip 120 is located on the top surface 111 of the substrate 110, in which the conductive foil 114 is located between the substrate 110 and the semiconductor chip 120, and the semiconductor chip 120 has a bonding pad 122 and is electrically connected to the conductive foil 114. The number of the conductive foils and the number of the bonding pads in the drawing are two, but the disclosure is not limited to it. A portion 114a of the conductive foil 114 and the bonding pad 122 are directly above the window 112 of the substrate 110. The conducting foil 114 is formed to electrically connect the semiconductor chip 120 and the substrate 110, such that when an electrical signal, for example, digital data, is transmitted to the substrate 110, the electrical signal will pass through the conductive foil 114 and into the semiconductor chip 120 for further processing.

The semiconductor package 100 further includes a molding compound 130 located on the top surface 111 of the substrate 110 and surrounds the semiconductor chip 120. The molding compound 130 has a portion 132 covering a top surface 123 of the semiconductor chip 120. The semiconductor package 100 further includes another portion 134 of the molding compound 130 located in the window 112 of the substrate 110 and extending to a bottom surface 113 of the substrate 110. The molding compound 130 is in contact with the conductive foil 114 and the bonding pad 122. In some embodiments, the shape of the molding compound 130 is determined by the shape of the mold and the molding compound 130 and the molding compound 130 are formed at the same time. The semiconductor package 100 further includes an adhesive layer 140 located between the semiconductor chip 120 and the substrate 110. The adhesive layer 140 is located on the top surface 111 of the substrate 110 and surrounds the window 112. The adhesive layer 140 is in contact with the conductive foil 114 of the substrate 110. In some embodiments, the adhesive layer 140 can be, for example, a layer of die attach film, but not limited to it.

The substrate 110 further includes a conductive via 116 located in the substrate 110 and through the top surface 111 of the substrate 110 and the bottom surface 113 of the substrate 110. A top end of the conductive via 116 is electrically connected to the conductive foil 114. The substrate 110 further includes a conductive region 118 electrically connected to a bottom end of the conductive via 116, and the semiconductor package further includes a solder ball 160 located on the conductive region 118. The amounts of the conductive foil 114, the conductive via 116, the conductive region 118 and the solder ball 160 are not limited to the amount shown in the drawings. The function of the conductive via 116, the conductive region 118 and the solder ball 160 is to electrically connect the semiconductor chip 120 and the conductive foil 114 to the outside the semiconductor package 100, such that the semiconductor chip 120 in the core of the semiconductor package 100 can electrically connect to other devices or components.

In the present embodiment, since the substrate 110 of the semiconductor package 100 has the window 112 and the conductive foil 114 extending beyond the inner sidewall 112a that surrounds the window 112, the bonding pad 122 of the semiconductor chip 120 can electrically connect to the conductive foil 114. As a result of such a design, the semiconductor package 100 is capable of working at high data rate without using bonding wires or copper pillars. Moreover, the manufacturing method of the semiconductor package uses the soldering of the conductive foil of the substrate to the bonding pad of the semiconductor chip to electrically connect the semiconductor chip and the substrate, which avoids the necessity of forming copper pillar in the manufacturing process, thereby reducing the cycle time and the cost of the manufacturing process.

It is to be noted that the connection relationships, the materials, and the advantages of the elements described above will not be repeated in the following description. In the following description, a manufacturing method of a semiconductor package is described.

Figure 2:
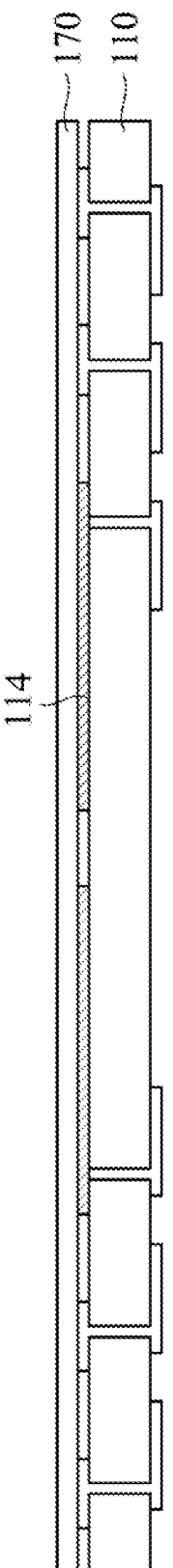
FIGS. 2 and 3 are cross-sectional views at intermediate steps of a manufacturing method of a semiconductor package according to one embodiment of the present disclosure.
Figure 3:
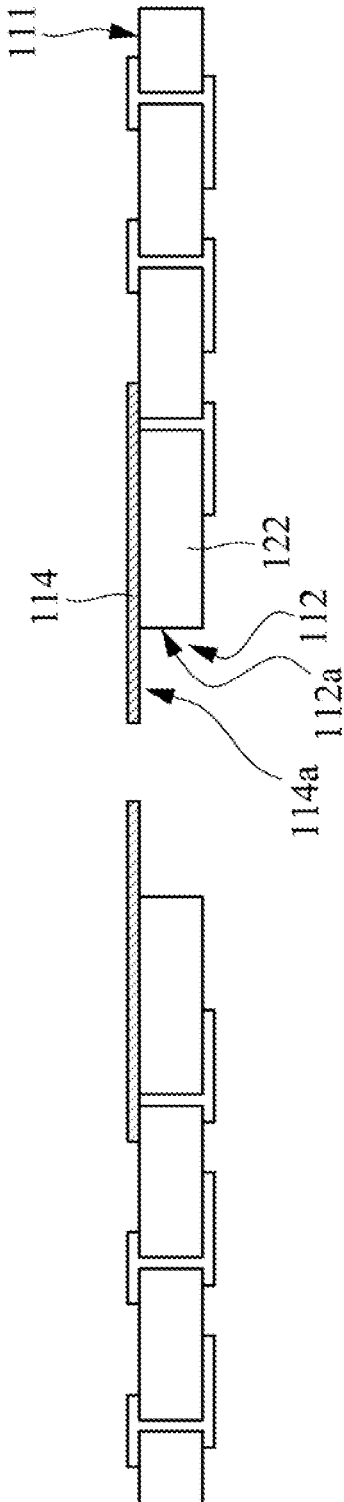

FIGS. 2 and 3 are cross-sectional views at intermediate steps of a manufacturing method of a semiconductor package according to one embodiment of the present disclosure. Refer to FIG. 2 and FIG. 3, The manufacturing method of the semiconductor package includes before forming the window 112 through the center portion of the substrate 110, disposing a support paper 170 on the conductive foil 114; and forming the window 112 through the center portion of the substrate 110, such that the substrate 110 has the inner sidewall 112*a* surrounding the window 112. The substrate 110 has a conductive foil 114 located on a first surface (i.e., the top surface 111) of the substrate 110 and extending beyond the inner sidewall 112*a* of the substrate 110. Since the thickness of the conductive foil 114 is relatively small (about 160 micrometers) compare to the thickness of the substrate 110 (about 1600 to 2000 micrometers), the support paper 170 can protect the conductive foil 114 from rupture before attaching the substrate 110 to the semiconductor chip 120. In some embodiments, the step of forming the window 112 through the center portion of the substrate 110 is performed by punching.

Figure 4:
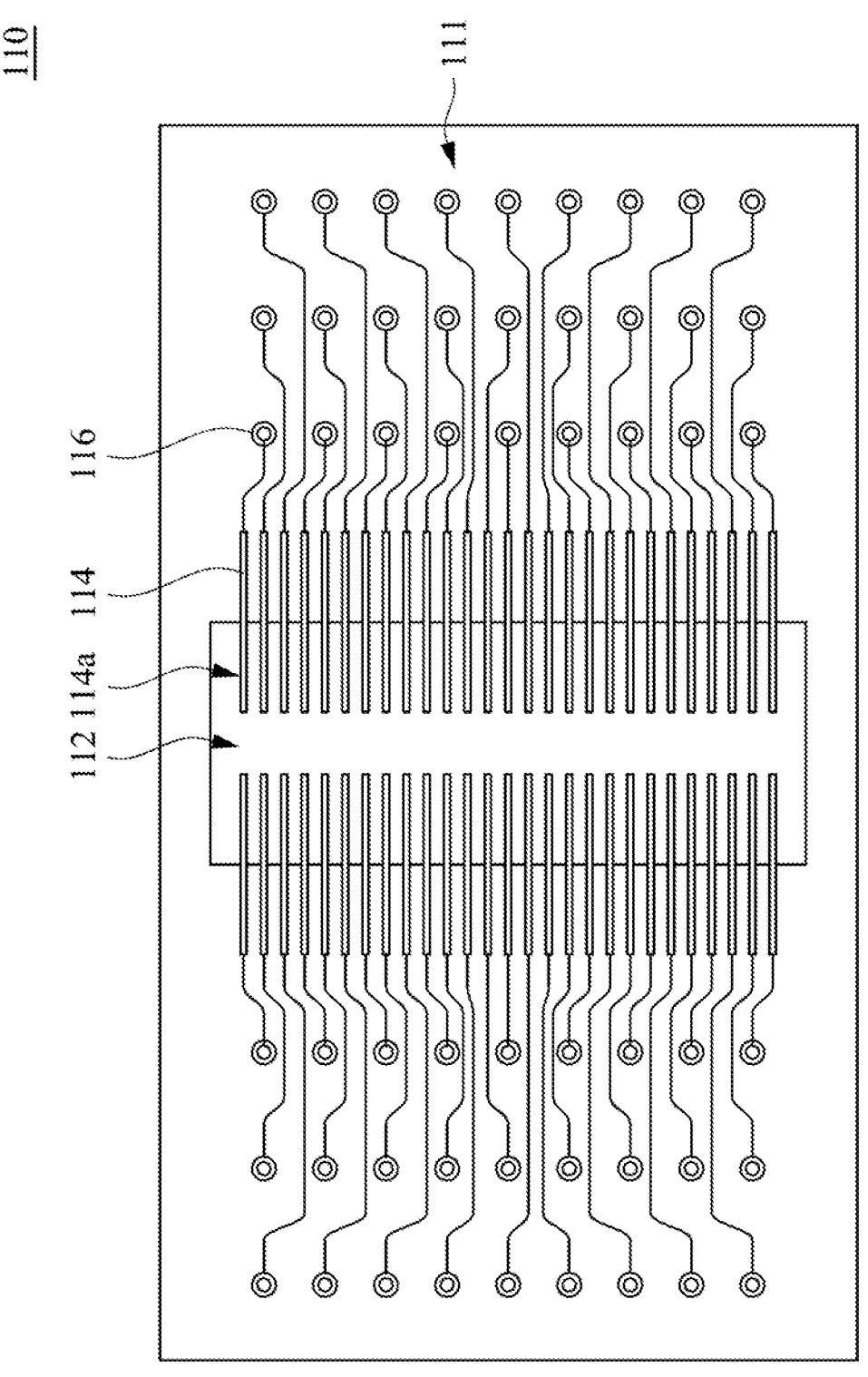
FIG. 4 is a top view of a substrate of the semiconductor package of FIG. 3.

FIG. 4 is a top view of the substrate 110 of the semiconductor package 100 of FIG. 3. Refer to FIG. 3 and FIG. 4, the substrate 110 includes the conductive foil 114 located on the top surface 111 of the substrate 110, and the conductive via 116. The top and of the conductive via 116 is electrically connected to the conductive foil 114. After the window 112 is formed, the portion 114*a* of the conductive foil 114 extends out of the inner sidewall of the window 112. As shown in FIG. 4, the electrical connection between the conductive foil 114 and the conductive via 116 is by a conductive line, but the conductive foil 114 can also directly connect the conductive via 116 by extending the length of the conductive foil 114. The number of the conductive foils 114 and the number of the conductive vias 116 are not limited to the amount shown in the drawings, but the conductive foil 114 and the conductive via 116 is one-to-one connected.

Figure 5:
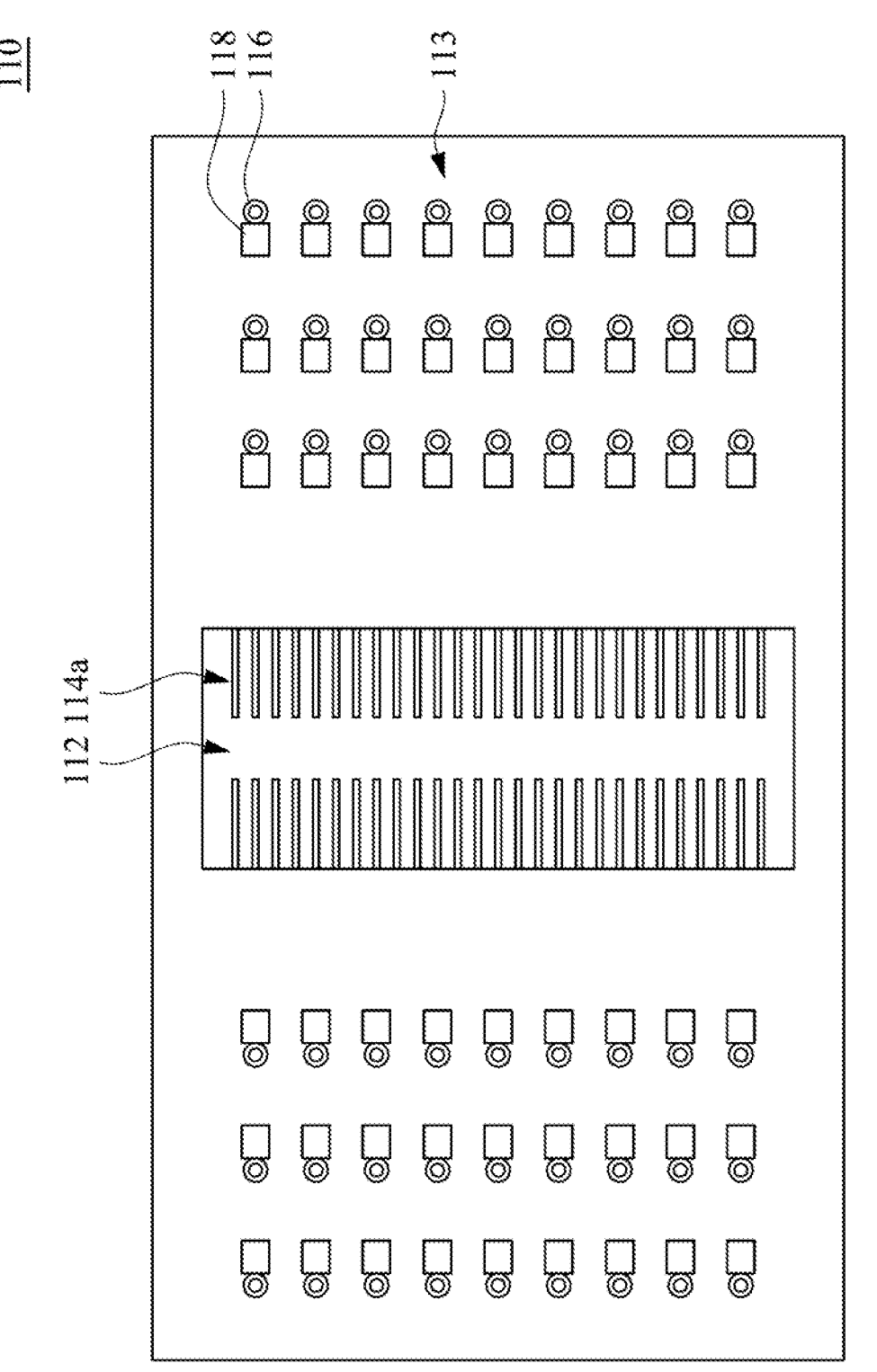
FIG. 5 is a bottom view of the substrate of the semiconductor package of FIG. 3.

FIG. 5 is a bottom view of the substrate 110 of the semiconductor package 100 of FIG. 3. Refer to FIG. 3 and FIG. 5, the substrate 110 includes the conductive region 118 on the bottom surface 113 of the substrate 110. The bottom end of the conductive via 116 is electrically connected to the conductive region 118. The electrical connection between the bottom end of the conductive via 116 and the conductive region 118 can directly connect or connect by a conductive line. The number of the conductive regions 118 is not limited to the number shown in the drawing, but the conductive via 116 and the conductive region 118 is one-to-one connected.

Figure 6:
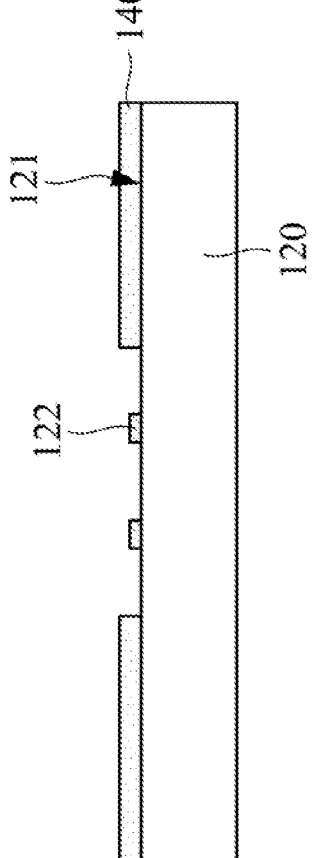
FIG. 6 to FIG. 12 are cross-sectional views of intermediate steps of the manufacturing method of the semiconductor package after the step of FIG. 3.
Figure 7:
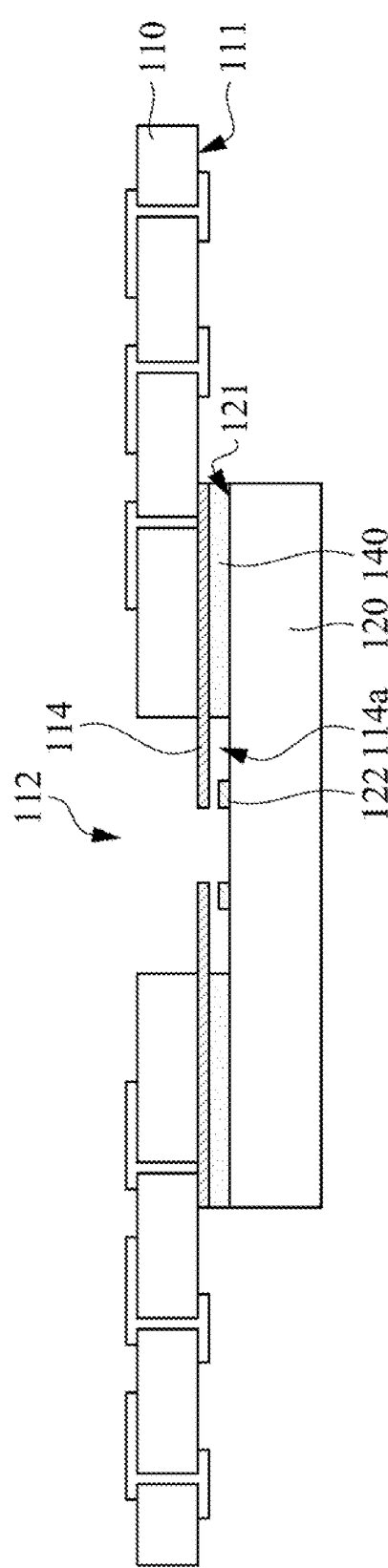

Refer to FIG. 6 and FIG. 7, after the step in FIG. 3, the adhesive layer 140 is attached to the semiconductor chip 120, in which the adhesive layer 140 surrounds the bonding pad 122 of the semiconductor chip 120. The support paper 170 of FIG. 2 is removed before attaching the substrate 110 to a first surface (i.e., the bottom surface 121) of the semiconductor chip 120. Thereafter, attaching the substrate 110 is attached to the adhesive layer 140 and the first surface 121 of the semiconductor chip 120 such that the conductive foil 114 is located between the substrate 110 and the semiconductor chip 120. In other words, the top surface 111 of the substrate 110 is attached to the bottom surface 121 of the semiconductor chip 120. In some embodiments, the adhesive layer 140 can be, for example, a layer of die attach film (DAF), and will be dried through a baking process to adhere the substrate 110 and the semiconductor chip 120, but not limited to it.

Figure 8:
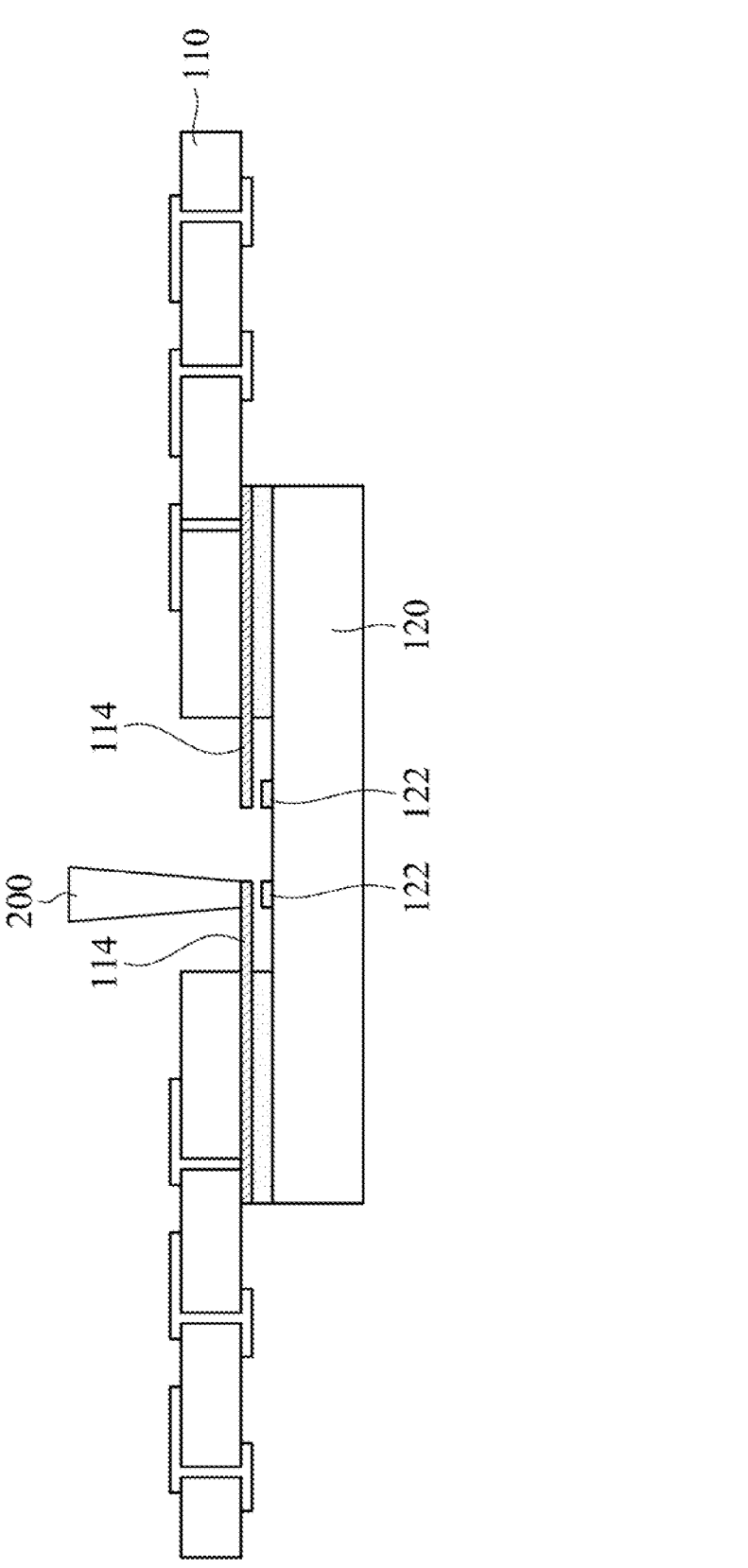
Figure 9:
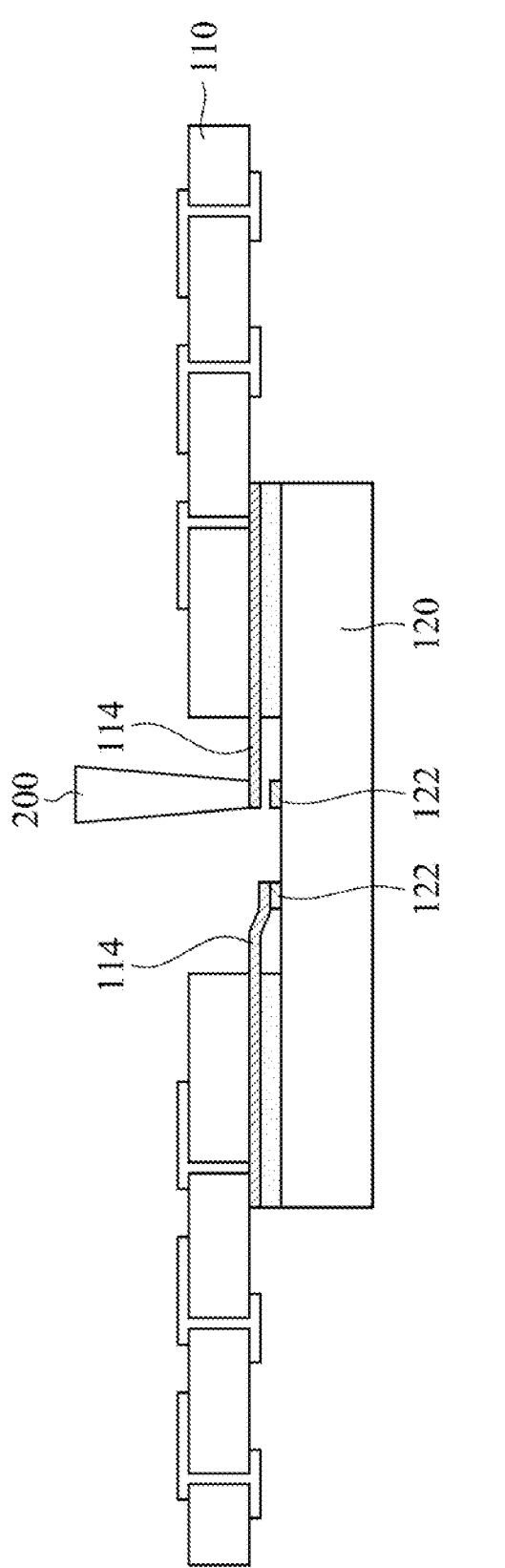
Figure 10:
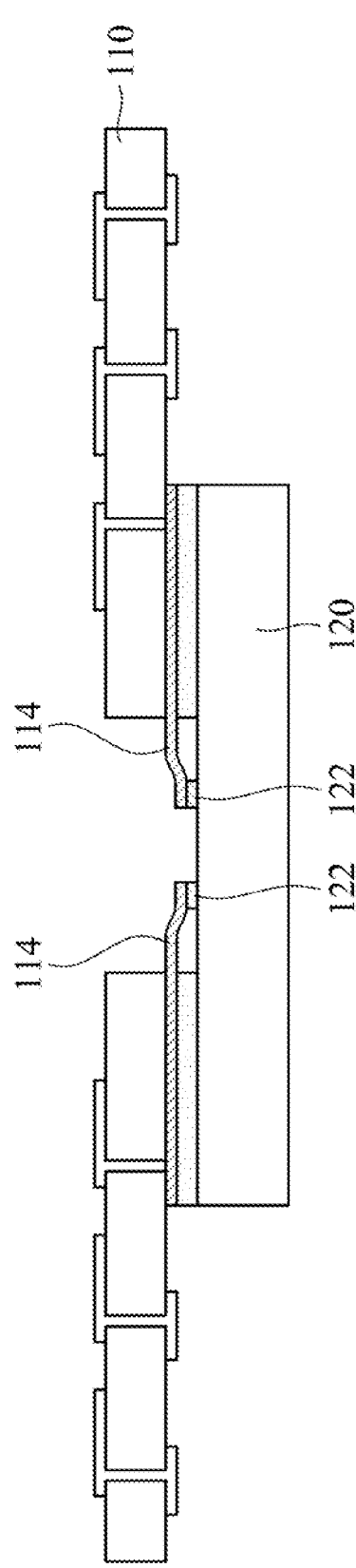

Refer to FIG. 8 to FIG. 10, after the structure of FIG. 7 is formed, the conductive foil 114 of the substrate 110 is soldered to the bonding pad 122 of the semiconductor chip 120 such that the bonding pad 122 of the semiconductor chip 120 electrically connects to the conductive foil 114. The step of soldering the conductive foil 114 of the substrate 110 to the bonding pad 122 of the semiconductor chip 120 may be performed by ultrasonic soldering through an apparatus 200. FIG. 10 shows the structure after the soldering of the conductive foil 114 of the substrate 110 to the bonding pad 122 is finished.

Figure 11:
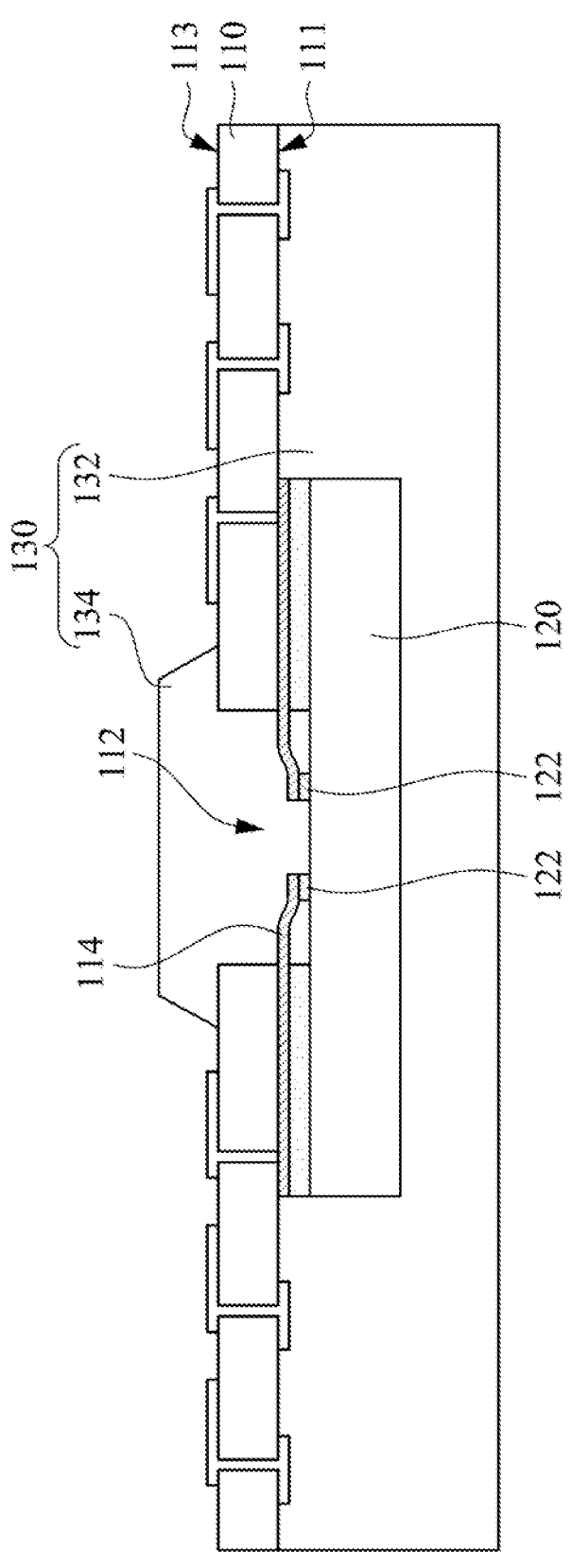

Refer to FIG. 11, thereafter, the first portion 132 of the molding compound 130 is formed on the first surface 111 of the substrate 110 and the second portion 134 of the molding compound 130 is formed in the window 112 of the substrate 110, in which the first portion 132 of the molding compound 130 surrounds the semiconductor chip 120 and covers the semiconductor chip 120, and the second portion 134 of the molding compound 130 extends to a second surface (i.e., the bottom surface 113) of the substrate 110 opposite the first surface 111 of the substrate 110. In some embodiments, the first portion 132 and the second portion 134 of the molding compound 130 are formed at the same time. The shape of the molding compound 130 is determined by the shape of a mold. In other words, the first portion 132 and the second portion 134 of the molding compound 130 are simultaneously formed in one molding step.

Figure 12:
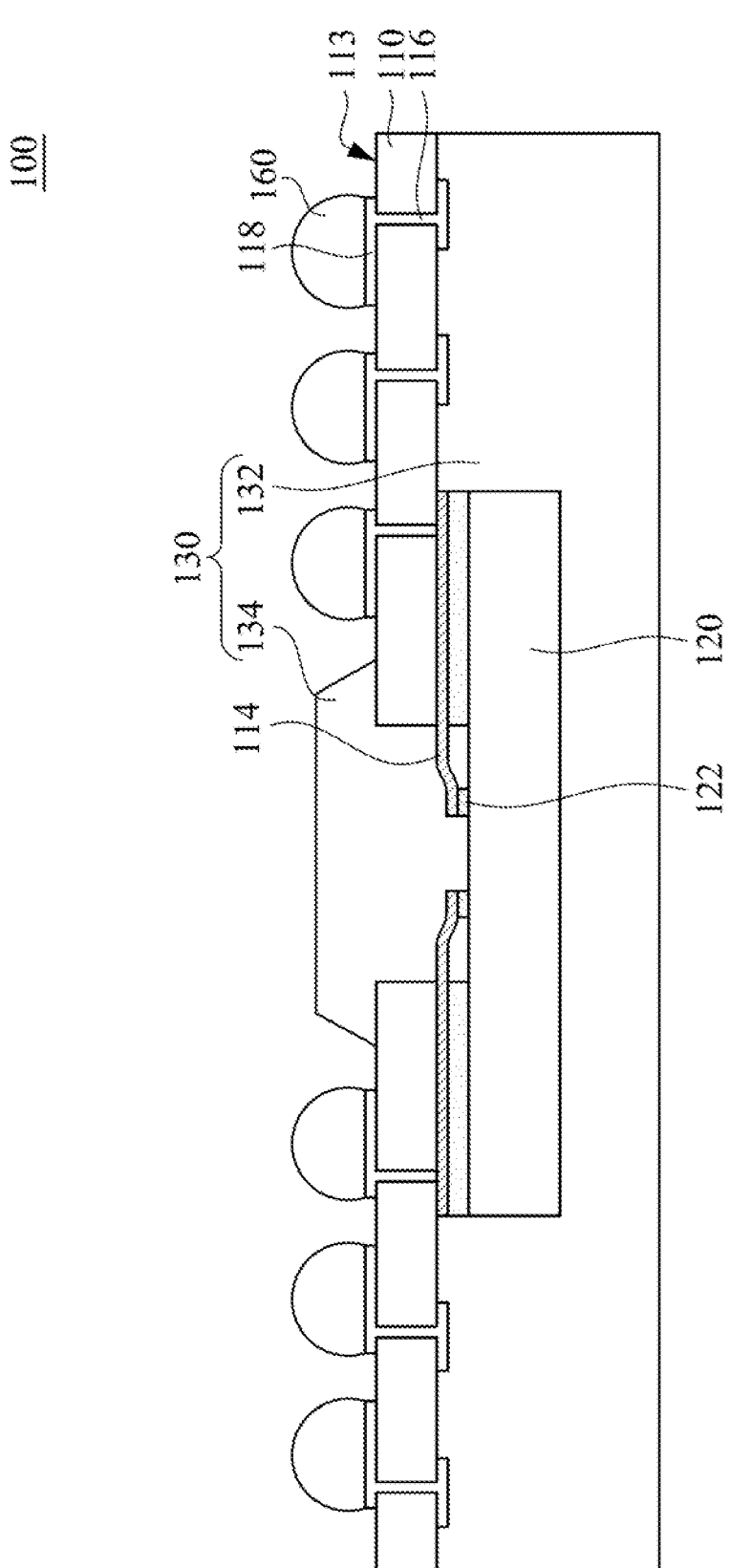

Refer to FIG. 12, after the formation of the molding compound 130, the solder ball 160 is soldered to the conductive region 118 such that the solder ball 160 is electrically connected to the conductive via 116. As a result, the semiconductor package 100 can be obtained. The method used in the soldering of the solder ball 160 can be solder reflowing, but not limited to it. By soldering the solder ball 160 to the conductive region 118, the semiconductor chip 120 is electrically connected to the solder ball 160 through the bonding pad 122, the conductive foil 114, the conductive via 116 and the conductive region 118, such that the semiconductor chip 120 of the semiconductor package 100 can electrically connect to other devices or components, such as an external printed circuit board (PCB).

In summary, since the substrate of the semiconductor package has a window and the conductive foil extending beyond the inner sidewall that surrounds the window, the bonding pad of the semiconductor chip can electrically connect to the conductive foil. As a result of such a design, the semiconductor package is capable of working at high data rate without using bonding wires or copper pillars. Moreover, the manufacturing method of the semiconductor package uses the soldering of the conductive foil of the substrate to the bonding pad of the semiconductor chip to electrically connect the semiconductor chip and the substrate, which avoids the necessity of forming copper pillar in the manufacturing process, thereby reducing the cycle time and the cost of the manufacturing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a substrate, comprising:
    a window through a center portion of the substrate, wherein the substrate has an inner sidewall surrounding the window; and
    a conductive foil located on a top surface of the substrate, wherein the conductive foil extends beyond the inner sidewall of the substrate, the conductive foil has a horizontal portion in direct physical contact and vertically overlapping the top surface of the substrate, and there is no molding compound between the horizontal portion of the conductive foil and the top surface of the substrate; and
a semiconductor chip located on the top surface of the substrate, wherein the conductive foil is located between the substrate and the semiconductor chip, and the semiconductor chip has a bonding pad electrically connected to the conductive foil.

2. The semiconductor package of claim 1, further comprising:
a molding compound located on the top surface of the substrate and surrounds the semiconductor chip.

3. The semiconductor package of claim 2, wherein the molding compound has a portion covering a top surface of the semiconductor chip.

4. The semiconductor package of claim 1, further comprising:
a molding compound located in the window of the substrate and extending to a bottom surface of the substrate.

5. The semiconductor package of claim 4, wherein the molding compound is in contact with the conductive foil and the bonding pad.

6. The semiconductor package of claim 1, wherein a portion of the conductive foil and the bonding pad are directly above the window of the substrate.

7. The semiconductor package of claim 1, further comprising:
an adhesive layer located between the semiconductor chip and the substrate.

8. The semiconductor package of claim 7, wherein the adhesive layer is located on the top surface of the substrate and surrounds the window.

9. The semiconductor package of claim 7, wherein the adhesive layer is in contact with the conductive foil of the substrate.

10. The semiconductor package of claim 1, wherein the substrate further comprises:
a conductive via located in the substrate and through the top surface of the substrate and a bottom surface of the substrate.

11. The semiconductor package of claim 10, wherein a top end of the conductive via is electrically connected to the conductive foil.

12. The semiconductor package of claim 10, wherein the substrate further comprises a conductive region electrically connected to a bottom end of the conductive via, and the semiconductor package further comprises:
a solder ball located on the conductive region.

* * * * *